United States Patent [19]

Hasegawa et al.

[11] Patent Number: 5,203,945
[45] Date of Patent: Apr. 20, 1993

[54] PLASMA PROCESSING APPARATUS HAVING DRIVING CONTROL SECTION

[75] Inventors: Isahiro Hasegawa, Zushi; Takashi Yokota, Yokohama, both of Japan

[73] Assignee: Tokyo Electron Limited, Tokyo, Japan

[21] Appl. No.: 800,025

[22] Filed: Nov. 29, 1991

[30] Foreign Application Priority Data

Nov. 30, 1990 [JP] Japan .................... 2-339786

[51] Int. Cl.⁵ .............................................. B44C 1/22
[52] U.S. Cl. ..................................... 156/345; 156/643;
118/723; 204/298.37
[58] Field of Search ............... 156/345, 643, 626, 627;
204/192.32, 298.31, 298.32, 298.37

[56] References Cited

U.S. PATENT DOCUMENTS

| | | | |
|---|---|---|---|
| 4,695,700 | 9/1987 | Provence et al. | 156/345 |
| 4,800,251 | 1/1989 | Matsuoka | 204/298.35 X |
| 4,838,978 | 6/1989 | Sekine et al. | 156/345 |

Primary Examiner—William A. Powell
Attorney, Agent, or Firm—Oblon, Spivak, McClelland, Maier & Neustadt

[57] ABSTRACT

A plasma processing apparatus includes a plasma processing section and a control section for controlling an operation of a driving system of the processing section. The control section includes a CPU, arranged to be separated from the plasma processing section, for outputting a digital control signal to the driving system of the plasma processing section, a first converter, arranged on the CPU side, for converting a parallel signal from the CPU into a serial signal, a second converter, arranged on the processing section side, for converting the serial signal from the first converter into a parallel signal and outputting the parallel signal to the processing section, a cable for transmitting a serial signal between the first converter and the second converter, and a timing control circuit for controlling timings of transmission/reception signals of the first and second converters.

15 Claims, 3 Drawing Sheets

PLASMA PROCESSING APPARATUS HAVING DRIVING CONTROL SECTION

BACKGROUND OF THE INVENTION

1. Field of the Invention

The present invention relates to a plasma processing apparatus such as a plasma etching apparatus having a driving control section.

2 Description of the Related Art

In a plasma etching apparatus, a control section send a driving control signal serving as a digital ON/OFF signal to various driving units on the basis of signals from various sensors arranged in a plasma processing section, such that the driving units of the apparatus are controlled. This control section has a host CPU (Central Processing Unit) at a position separated from the plasma processing section, and various signals are transmitted/received between the CPU and the various sensors and driving units. That is, signals are transmitted from the various sensors to the host CPU, and on the basis of these signals, the host CPU supplies control signals to the driving units. In general, digital signals are parallelly output from the host CPU to the driving units, i.e., units to be controlled, through an I/O port.

In a plasma processing apparatus such as a plasma etching apparatus, there are a large number of parts to be digital-controlled, i.e., about 200 points in the output section and about 100 points in the input section. For this reason, when conventional parallel transmission is performed, a very large number of cables must be arranged.

In a plasma processing apparatus, since a host CPU is normally separated from a plasma processing section, the plasma processing apparatus easily receives noise generated due to a ground level difference between the host CPU and the processing unit. In addition, the plasma processing apparatus is easily influenced by noise generated from a high-frequency power supply in the plasma processing section. When a digital signal is used, since the signal is determined as "1" or "0" depending on whether its signal level exceeds a predetermined threshold level from the ground level, the plasma processing apparatus is erroneously operated by noise. Therefore, a countermeasure, for example, sufficient shielding of cables, against noise must be performed.

However, since the plasma processing apparatus has a large number of cables as described above, it is substantially impossible that all the cables are sufficiently shielded to protect the cables from noise.

SUMMARY OF THE INVENTION

It is an object of the present invention to provide a plasma processing apparatus having a driving control section capable of decreasing the number of cables for connecting a control section to a processing unit, and being hard to receive influence of a nize.

According to the present invention, there is provided a plasma processing apparatus having a driving control section, comprising a plasma processing section, having a driving system, for performing plasma processing and a control section for controlling an operation of the driving system of the plasma processing section, the control section including control means, arranged to be separated from the plasma processing section, for outputting a digital control signal to the driving system of the plasma processing section, first converting means, arranged on a side of the control means, for converting a parallel signal from the control means into a serial signal, second converting means, arranged on a side of the processing unit, for converting the serial signal from the first converting means into a parallel signal and outputting the parallel signal to the processing unit, transmitting means for transmitting the serial signal between the first converting means and the second converting means, and a timing control circuit for controlling timings of transmission/reception signals of the first and second converting means.

According to the present invention, the first converting means on a control means side and the second converting means on a driving unit side are arranged, and signals therebetween are serially transmitted, thereby decreasing the number of transmission cables. Therefore, an influence of noise can be reduced by a countermeasure, for example, sufficient shielding of the transmission cable. In addition, since the timing control circuit is arranged, parallel/serial conversion can be controlled without using a control means such as a CPU, and a load on the control means can be reduced. That is, when the parallel/serial conversion is performed by the above control means, since command data serving as a conversion timing is inserted in converted serial data, a data content is increased to increase the load on the control means. However, since the timing control circuit is arranged according to the present invention, the parallel/serial conversion can be performed without using the control means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Preferred embodiments of the present invention will be described below with reference to the accompanying drawings.

Figure 1:
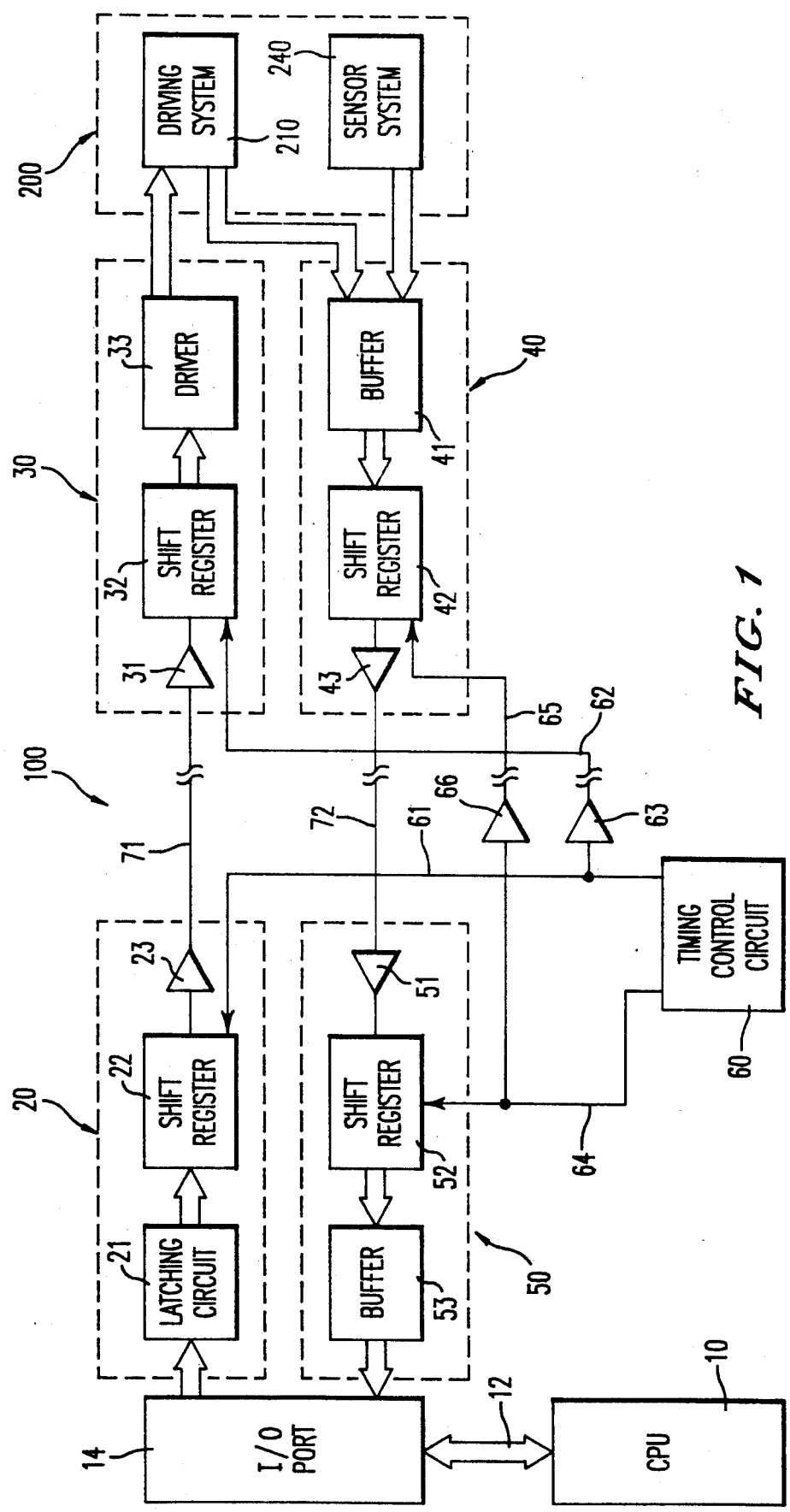
FIG. 1 is a circuit diagram showing a plasma processing apparatus having a control section according to an embodiment of the present invention.

FIG. 1 is a circuit diagram showing a plasma processing apparatus having a control section according to an embodiment of the present invention. The plasma processing apparatus comprises a plasma processing section 200 and a control section 100 for controlling an operation of the plasma processing section 200. The control section 100 includes a CPU 10 arranged at a position separated from the processing unit 200 by, for example, several tens of meters, an I/O port 14 connected to the CPU 10 through a data bus 12, a first converter 20 arranged on the CPU 10 side and connected to the I/O port 14, a second converter 30 arranged on the processing unit 200 side and connected to the first converter 20 through a cable 71, and a timing control circuit 60 for outputting a timing control signal to the first and second converters 20 and 30.

The second converter 30 is connected to various driving units of a driving system 210 for performing various driving operations required for performing plasma processing, for example, plasma etching, in the plasma processing section 200. As the driving units of the driving system 210, there are a large number of parts such as a motor, a pump, and a valve.

Digital control signals from the CPU 10 are output to the driving units of the driving system 210 through the data bus 12, the I/O port 14, the first converter 20, and the second converter 30.

In the first converter 20, a parallel signal is latched by a latching circuit 21. The latched signal is converted into a serial signal by a shift register 22 and supplied to an output circuit 25. The cable 71 is connected to the output circuit 25, and the serial signal is transmitted through the cable 71.

In the second converter 30, the serial signal transmitted through the cable 71 is input to an input circuit 31 and supplied to a shift register 32. In the shift register 32, the input serial signal is converted into a parallel signal and output to a driver 33 constituted by, for example, a latching circuit. A parallel control signal from the driver 33 is output to each of the driving units such as a motor, a pump, and a valve of the driving system 210 of the processing section 200 to control operations of the driving units.

The timing control circuit 60 outputs a timing signal to the first and second converters 20 and 30 to control a timing of a transmission signal of the first converter 20 and a timing of a reception signal of the second converter 30. This timing control circuit 60 supplies a transmission/reception timing signal to the shift register 22 through a signal line 61 and to the shift register 32 through a signal line 62 and an output circuit 63 to synchronize a transmission timing with a reception timing. This transmission/reception timing signal is constituted by a reference clock and a sync signal having a predetermined number of bits, for example, 8 bits, corresponding to one data length.

The control section further includes a third converter 40 arranged at a position corresponding to the second converter 30 and a fourth converter 50 arranged at a position corresponding to the first converter 20. Detection signals from sensors of a sensor system 240 of the processing section 200 are output to the CPU 10 as feedback signals through the third converter 40, the fourth converter 50, the I/O port 14, and the data bus 12. Signals for recognizing the ON/OFF states of the driving units of the driving system 210 are also output to the CPU 10 as described above. The sensor system 240 of the processing section 200 is used for detecting a temperature and a pressure in, e.g., plasma etching processing.

In the third converter 40, detection signals from the sensors and signals from the driving units are stored in a buffer 41 constituted by, e.g., a latching circuit. A signal from the buffer 41 is converted into a serial signal by a shift register and supplied to an output circuit 43. A cable 72 is connected to the output circuit 43, and the serial signal is transmitted through the cable 72.

In the converter 50, a serial signal transmitted through the cable 72 is input to a input circuit 51 and supplied to the shift register 52. In the shift register 52, the input serial signal is converted into a parallel signal, and it is output to a buffer 53. The parallel signal from the buffer 53 is supplied to the CPU 10 through the I/O port 14 and the data bus 12. The CPU 10 outputs the above-described control signal on the basis of the signals, i.e., feedback signals, from the sensors and driving units.

In the third and fourth converters 40 and 50, timings of the transmission/reception signals are controlled by the timing control circuit 60. For example, a transmission/reception timing signal for synchronizing transmission timing with a reception timing is supplied from the timing control circuit 60 to the shift register 42 through a signal line 65 and an output circuit 66 and to the shift register 52 through a signal line 64.

In the plasma processing apparatus having the control section 100, since transmission/reception of data between the CPU 10 and the processing section 200 can be performed using serial signals by the converters arranged in the control section 100, the number of cables can be decreased. Therefore, the cables 71 and 72 are constituted by coaxial cables or the like to obtain sufficient cable shielding, such that a satisfactory countermeasure against noise can be obtained.

Since signal timings in conversion between a parallel signal and a serial signal can be controlled by means of the timing control circuit 60, load on the CPU 10 can be reduced. That is, when the CPU 10 performs the above timing control, signals representing the start an end of each data must be inserted to the data. However, this is unnecessary in this embodiment, since the timing control signal 60 is arranged. Therefore, the load on the CPU 10 is reduced.

Serial signal transmission according to another embodiment of the present invention will be described below. A serial signal from a shift register 22 of a first converter 20 is transmitted from a differential output circuit 24 through a cable 73 having two lead lines. The serial signal from the cable 73 is supplied to a shift register 32 of a second converter 30 through a differential input circuit 34.

Figure 3:
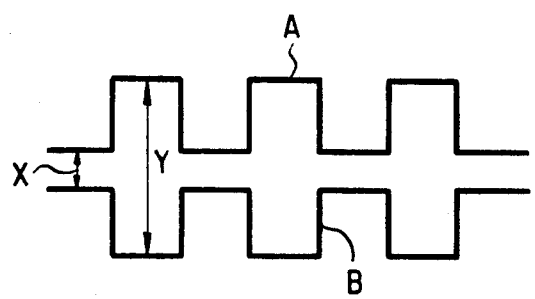
FIG. 3 is a view showing a signal used when the serial signal transmission in FIG. 2 is performed.
Figure 4:
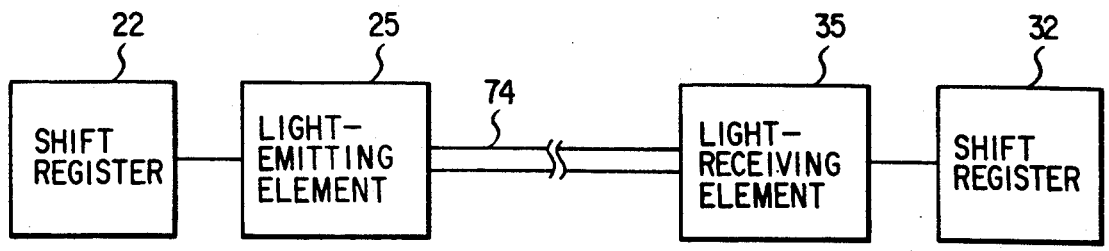
FIG. 4 is a view showing serial transmission according to still another embodiment of the present invention.

When a serial signal is transmitted as described above, a first signal A and a second signal B serving as an inverted signal of the first signal A are transmitted to the second converter 30 through the cable 73 without shifting the phases of these signals, as shown in FIG. 3. In this case, since the signals A and B can determine whether a signal level is set in High or Low, a level difference can be recognized as a difference between X and Y shown in FIG. 3, and a level difference twice that obtained when only the signal A is used can be obtained. Therefore, even when a cable receives noise, an erroneous operation is hard to be performed. That is, signal transmission having high resistance to noise can be performed. Note that, as a cable used in this case, a cable complying with, for example, the RS-422 standard can be used.

Serial signal transmission according to still another embodiment of the present invention. A serial signal from a shift register 22 of a first converter 20 is converted to light signal by a light-emitting element 25 and transmitted through an optical fiber 74. The light signal from the optical fiber 74 is converted to electrical signal by a light-receiving element 35 and supplied to a shift register 32 of a second converter 30. When a signal is transmitted through an optical fiber, signal transmission can be performed without receiving an influence of noise. Therefore, the signal transmission having very high resistance to noise can be obtained.

When a parallel signal is to be transmitted, the signal transmission using an optical fiber cannot be substantially performed due to a very large number of cables. However, when a serial signal is transmitted as in the present invention, since the number of cables can be reduced, the signal transmission using an optical fiber can be performed.

Figure 2:
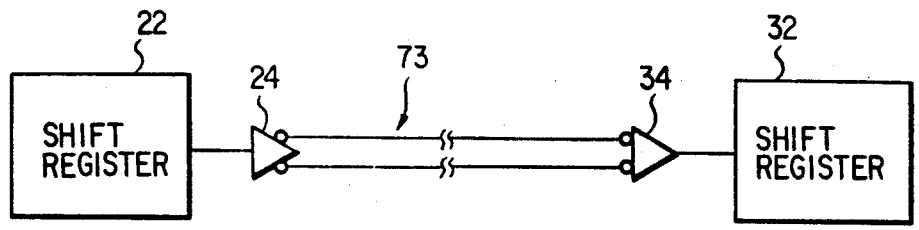
FIG. 2 is a view showing serial signal transmission according to another embodiment of the present invention.

The signal transmission between the third converter 40 and the fourth converter 50 in the above embodiment can be performed as in FIGS. 2 and 3.

A processing section when a magnetron plasma etching apparatus is used as a plasma processing apparatus according to the present invention will be described below.

Figure 5:
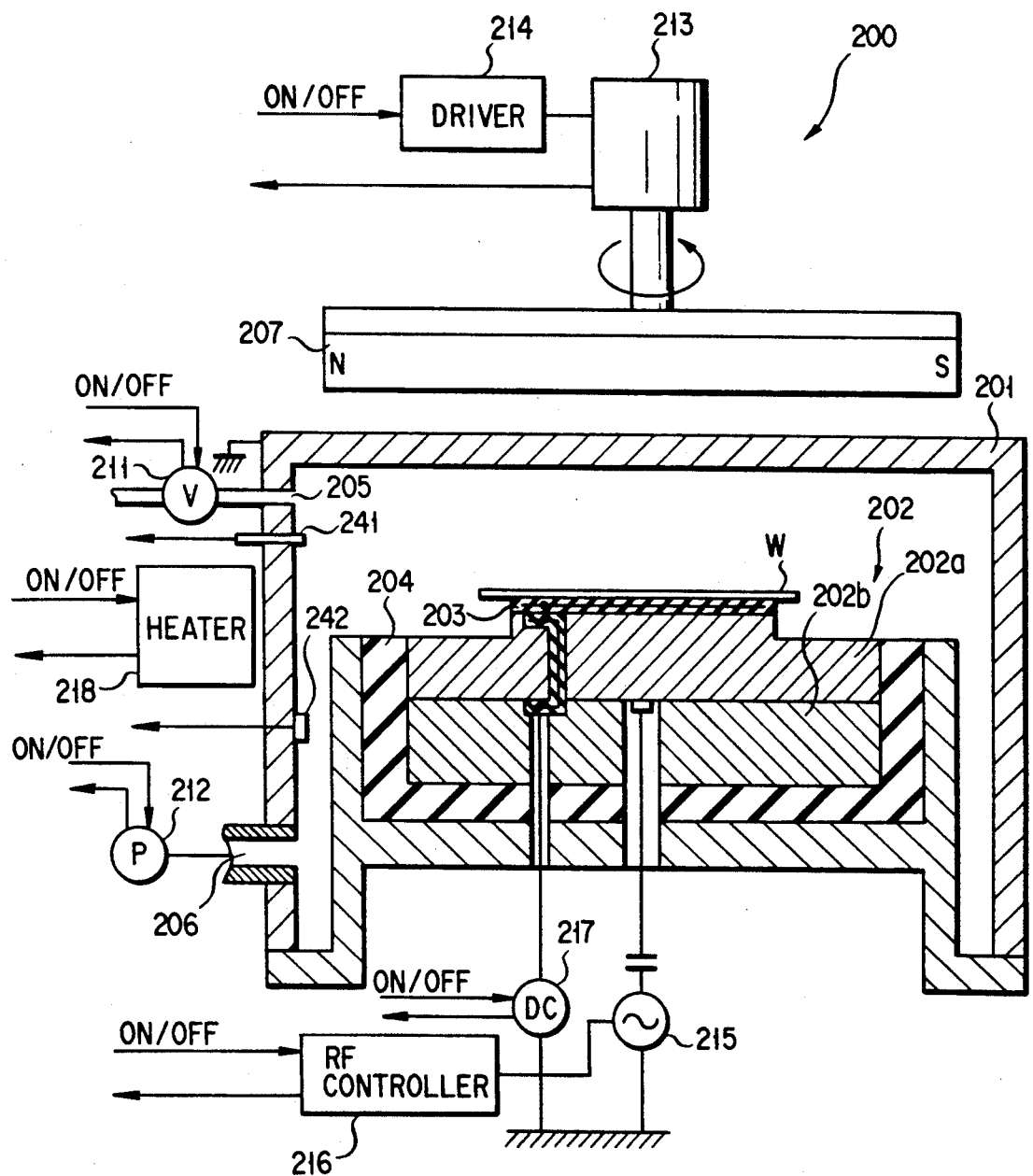
FIG. 5 is a view showing a processing unit in a plasma processing apparatus according to the present invention.

FIG. 5 is a schematic view showing the processing section of the magnetron etching apparatus. A processing section 200 includes a vacuum chamber 201. A susceptor 202 for supporting a wafer W serving as an object to be processed is arranged in the chamber 201, and an electrostatic chuck 203 for chucking the wafer W with the Coulomb force is arranged on the susceptor 202. The susceptor 202 includes an upper susceptor 202a and a lower susceptor 202b. The susceptor 202 is arranged on the bottom wall of the chamber 201 through a ceramic member 15, and the chamber 201 and the susceptor 202 are electrically insulated from each other.

A gas inlet 205 for guiding an etching gas is formed in the upper side wall of the chamber 201, and an outlet 206 for vacuuming the chamber is formed in the lower side wall of the chamber 201.

The upper wall of the chamber 201 serves as an upper electrode, and the upper susceptor 202a serves as a lower electrode. When an electric field is applied between the upper and lower electrodes, a plasma of the etching gas is produced. In FIG. 5, the upper electrode is grounded, and the lower electrode serves as an RF cathode. A magnet 207 is arranged above the chamber 201, such that a magnetic field perpendicular to the above electric field is applied between the electrodes.

In this processing section, as driving units included in a driving system, there are a valve 211 for ON/OFF-controlling supply of the etching gas from the gas inlet 205, a dry pump 212 for evacuating the chamber from the outlet 206, a motor 213 for rotating the magnet 207, an RF power supply 215 for supplying an RF power to the upper chamber 202a serving as the lower electrode, a DC power supply 217 for supplying a DC power to the electrostatic chuck 203, a heater 218 for heating the inside of the chamber 201, and the like. These units are ON/OFF-controlled by control signals from the CPU. A signal representing an ON/OFF state is output from these driving units to the CPU 10. A signal related to the RF power supply 215 is transmitted/received through an RF controller 216. An ON/OFF signal is supplied to the motor 213 through a driver 214.

As sensors included in a sensor system 240, a thermometer 214 for detecting the temperature in the chamber 201, a manometer 242 for detecting the pressure in the chamber 201, and the like are arranged.

In the processing section of the magnetron plasma etching apparatus, after the chamber 201 is evacuated by the dry pump 212, an etching gas is supplied from the gas inlet 205 to the chamber 201, and an RF power having a frequency of, e.g., 13.75 MHz is applied from the RF power supply 215 between the upper and lower electrodes. In this state, a magnetic field perpendicular to the electric field is applied between the electrodes by a rotating permanent magnet 32 to generate a magnetron plasma discharge. Thus, the wafer W is etched. The above sequential operations are controlled by a control section 100.

Operations of the processing section 200 controlled by the control section 100 are described below in time series.

(1) One of wafers to be processed is picked up from a wafer carrier and placed on the electrostatic chuck 203 of the chamber 201 through a load-lock chamber (not shown).

(2) The power supply 217 is turned on to apply a voltage to the electrostatic chuck 203 to attract the wafer W.

(3) The dry pump 212 is ON/OFF-controlled to allow the chamber 201 to have a predetermined pressure.

(4) The RF power supply 215 is set in an ON state to apply an RF power between the upper wall of the chamber 201 and the susceptor 202.

(5) The valve 211 is turned on (opened) to supply the etching gas to the upper portion of the wafer W.

(6) The state of the magnetron plasma discharge generated above the wafer W is detected and controlled.

(7) An end of plasma RIE etching is detected on the basis of the magnetron plasma discharge state to stop the etching.

(8) Upon etching, the valve 211 is turned off (closed) to stop the supply of the etching gas.

(9) Thereafter, the RF power supply is turned off to stop the application of the RF power.

(10) After exhaustion of the reacted gas is detected, the power supply 217 is turned off to stop applying the voltage to the electrostatic chuck.

(11) The processed wafer is unloaded through the load-lock chamber (not shown).

(12) The following processing program for the wafer is to be executed.

When the etching operations are performed in the processing section 200 as described above, since electrons located between the electrodes are subjected to cyclotron movement by the rotating permanent magnet 32, the number of molecular ionization cycles caused by collision between the electrons and molecules is increased. For this reason, even when a relatively low pressure, i.e., $10^{-2}$ to $10^{-3}$ Torr, is set, a high etching rate, e.g., 1 $\mu$m/min, can be obtained. Therefore, processing per wafer can be performed within a short time, and the reliability of etching is improved. In addition, since an average energy of ions is kept to be low, the wafer is slightly damaged.

The present invention is not limited to the above embodiment, and various modifications can be effect without departing from the spirit and scope of the present invention. For example, the present invention can be applied not only to a plasma etching apparatus but to various plasma processing apparatuses such as a plasma sputtering apparatus and a plasma CVD apparatus in which processing is performed using a plasma.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processing apparatus having a driving control section comprising:
   a plasma processing section, having a driving system, for performing plasma processing; and
   a control section for controlling an operation of the driving system of said plasma processing section,
   said control section having
   control means, arranged to be separated from said plasma processing section, for outputting a digital control signal to the driving system of said plasma processing section,
   first converting means, arranged on a side of said control means, for converting a parallel signal from said control means into a serial signal,
   second converting means, arranged on a side of said processing section, for converting the serial signal from said first converting means into a parallel signal and outputting the parallel signal to said processing section,
   transmitting means for transmitting a serial signal between said first converting means and said second converting means, and
   a timing control circuit for controlling timings of transmission/reception signals for said first and second converting means.

2. An apparatus according to claim 1, wherein said timing control circuit outputs a reference clock and a conversion sync signal to said first and second converting means.

3. An apparatus according to claim 1, wherein said first converting means includes a latching circuit for latching a parallel signal, a shift register for converting a latched signal into a serial signal, and an output circuit for outputting the serial signal.

4. An apparatus according to claim 3, wherein said output circuit has a differential output circuit, said differential output circuit outputting a first signal and a second signal serving as an inverted signal of the first signal.

5. An apparatus according to claim 3, wherein said second converting means includes an input circuit for inputting a serial signal, a shift register for converting the serial signal into a parallel signal, and a driver for outputting the parallel signal to the processing section.

6. An apparatus according to claim 1, wherein said transmitting means has a coaxial cable.

7. An apparatus according to claim 1, wherein said transmitting means has an optical fiber.

8. An apparatus according to claim 1, further comprising third converting means for converting a feedback signal from said processing section into a serial signal, fourth converting means for converting the serial signal from said third converting means into a parallel signal and outputting the parallel signal to said control means, transmitting means for transmitting a serial signal between said third converting means and said fourth converting means, and a timing control circuit for controlling timings of transmission/reception signals for said third and fourth converting means.

9. An apparatus according to claim 8, wherein said third converting means includes a buffer for storing a feedback signal from said processing section, a shift register for converting a signal from said buffer into a serial signal, and an output circuit for outputting a serial signal.

10. An apparatus according to claim 9, wherein said output circuit has a differential output circuit, said differential output circuit outputting a first signal and a second signal serving as an inverted signal of the first signal.

11. An apparatus according to claim 8, wherein said fourth converting means includes an input circuit for inputting a serial signal, a shift register for converting a serial signal into a parallel signal, and a buffer for storing a parallel signal.

12. An apparatus according to claim 8, wherein said transmitting means for transmitting a serial signal between said third converting means and said fourth converting means has a coaxial cable.

13. An apparatus according to claim 8, wherein said transmitting means for transmitting a serial signal between said third converting means and said fourth converting means has an optical fiber.

14. An apparatus according to claim 1, wherein said processing section includes a driving system having a driving unit to be controlled and a sensor system having a sensor for detecting a processing state.

15. An apparatus according to claim 14, wherein said processing section performs plasma etching processing.

* * * * *